United States Patent
Greenbaum

[19]

[11] Patent Number: 6,143,989
[45] Date of Patent: *Nov. 7, 2000

[54] ACTIVE ALIGNMENT/CONTACT VERIFICATION SYSTEM

[75] Inventor: William M. Greenbaum, Modesto, Calif.

[73] Assignee: The Regents of the University of California, Oakland, Calif.

[ * ] Notice: Under 35 U.S.C. 154(b), the term of this patent shall be extended for 662 days.

[21] Appl. No.: 08/504,478

[22] Filed: Jul. 20, 1995

[51] Int. Cl.⁷ ....................................................... H05K 1/00
[52] U.S. Cl. ............................................ 174/250; 361/792
[58] Field of Search ............................ 29/830, 829, 832; 361/792; 174/255, 261, 250

[56] References Cited

U.S. PATENT DOCUMENTS

| | | | |
|---|---|---|---|
| 3,967,162 | 6/1976 | Ceresa et al. | 317/101 CM |
| 5,343,616 | 9/1994 | Roberts | 29/846 |
| 5,466,892 | 11/1995 | Howard et al. | 174/261 |
| 5,468,917 | 11/1995 | Brodsky et al. | 174/255 |

*Primary Examiner*—Jeffrey Gaffin
*Assistant Examiner*—Kamand Cuneo
*Attorney, Agent, or Firm*—L. E. Carnahan; Alan H. Thompson

[57] ABSTRACT

A system involving an active (i.e. electrical) technique for the verification of: 1) close tolerance mechanical alignment between two component, and 2) electrical contact between mating through an elastomeric interface. For example, the two components may be an alumina carrier and a printed circuit board, two mating parts that are extremely small, high density parts and require alignment within a fraction of a mil, as well as a specified interface point of engagement between the parts. The system comprises pairs of conductive structures defined in the surfaces layers of the alumina carrier and the printed circuit board, for example. The first pair of conductive structures relate to item (1) above and permit alignment verification between mating parts. The second pair of conductive structures relate to item (2) above and permit verification of electrical contact between mating parts.

18 Claims, 3 Drawing Sheets

ACTIVE ALIGNMENT/CONTACT VERIFICATION SYSTEM

The United States Government has rights in this invention pursuant to Contract No. W-7405-ENG-48 between the United States Department of Energy and the University of California for the operation of Lawrence Livermore National Laboratory.

BACKGROUND OF THE INVENTION

The present invention relates to alignment of mating parts, particularly to verification that parts are aligned and in contact with each other, and more particularly to a system which provides a positive and accurate method of verifying alignment and contact of mating parts.

There are numerous applications requiring precision mating of parts, from large and bulkier parts to extremely small, high density parts. In certain applications the alignment must be "blind" (i.e., cannot be aligned visually), and other applications are impractical or impossible for prior known alignment mechanisms. Thus, there is a need for an alignment verification system for any mating parts where structures meet directly or through a conductive interface.

This need is satisfied by the present invention which involves an active system for verification of: 1) close tolerance mechanical alignment, and 2) electrical contact between mating components. The invention is particularly applicable for verification of two mating parts that are extremely small, high density parts, such as an alumina carrier and a printed circuit board. The invention consists of system using conductive patterns or features for mating components (e.g., alumina substrate/printed circuit board) that enable electrical alignment verification, elastomeric interface engagement verification, and "blind" alignment of such parts to close tolerances.

SUMMARY OF THE INVENTION

It is an object of the present invention to provide an alignment/contact verification system.

A further object of the invention is to provide an active (i.e., electrical) technique for verification of close tolerance alignment and contact between mating assemblies.

A further object of the invention is to provide a system that provides alignment verification with close tolerance between mating parts and enable electronic verification of elastomeric interface engagement of the parts.

Another object of the invention is to provide an active alignment/contact verification system which utilizes conductive patterns or features for mating components that enable electrical alignment verification, elastomeric interface engagement verification and "blind" alignment of parts to close tolerances.

Another object of the invention is to provide an active alignment/contact verification system for two mating parts that are extremely small, high density parts and which require alignment within a fraction of a mil.

Another object of the invention is to provide an electrical alignment and contact verification of an alumina carrier or substrate and a printed circuit board.

Other objects and advantages of the present invention will become apparent from the following description and accompanying drawings. Basically the invention involves an active technique for the verification of: 1) close tolerance mechanical alignment, and 2) electrical contact between mating assemblies. More specifically the invention involves an electrical technique for the verification of alignment between and alumina carrier and a printed circuit board, as well as electrical verification of contact between mating assemblies of the alumina carrier and the printed circuit board. The system utilizes pairs of conductive structures defined in the surface layers of the alumina carrier or substrate and the printed circuit board (PCB), for example. The first pair of conductive structures relate to verification of close tolerance mechanical alignment and permit alignment verification between mating parts. The second pair of conductive structures relate to contact between mating parts and permit verification of electrical contact between parts.

Other uses of the invention include alignment verification of any mating parts where conductive structures meet directly or through a conductive interface. A potential use variation of the technique of the present invention is to measure capacitance rather than resistance. This variation uses the conductive path linking structures on a substrate and a printed circuit board as one plate of a capacitor. Backside metalization of the substrate is the other plate of the capacitor. The alumina substrate is the dielectric. In this variation, the "conductive path" creates the largest "plate" when optimum alignment is achieved. The value of this approach is that the structures can be designed to enable "blind" alignment. The contact structures and associated technique provide a reliable way to characterize various elastomeric interfaces.

BRIEF DESCRIPTION OF THE DRAWINGS

The accompanying drawings, which are incorporated into and form a part of the disclosure, illustrate an embodiment of the invention and, together with the description, serve to explain the principles of the invention.

DETAILED DESCRIPTION OF THE INVENTION

Figure 1A:
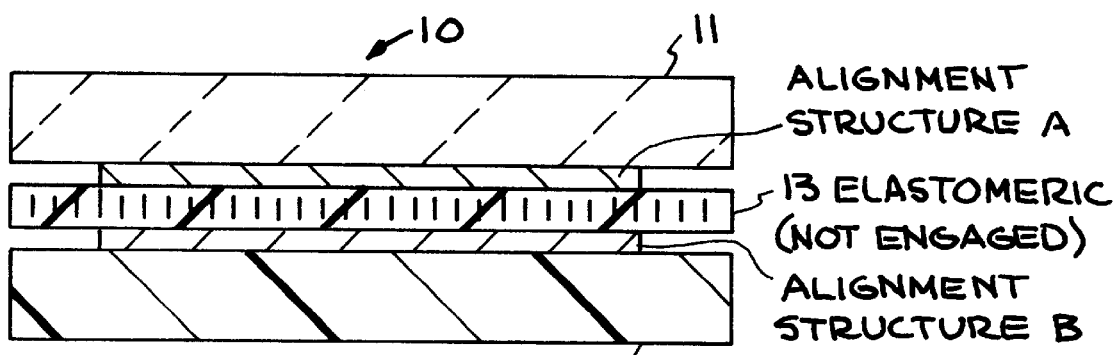
FIG. 1A is a cross-sectional side view of an embodiment of the alignment structures of the present invention, with the elastomeric interface not engaged.

The present invention is directed to an active alignment/contact verification system. The invention provides an active (i.e. electrical) technique for the verification of (1) close tolerance mechanical alignment between components, such as alumina carriers or substrates and a printed circuit board (PCB), and (2) electrical contact between mating assemblies of these components through an elastomeric interface. The invention utilizes conductive patterns or features for mating components (e.g. alumina substrate/PCB) that enables electrical alignment verification, elastomeric interface engagement verification, and "blind" alignment of such parts to close tolerances.

While the invention may be utilized for a wide variety of applications involving alignment/contact verification, it is particularly applicable for mating parts, such as an alumina carrier and a PCB, that are extremely small, high density parts. The system provides a positive and accurate method for verifying alignment of the two parts to a close tolerance. Functionality of the alumina carrier is dependent on alignment within a fraction of a mil, thus creating the need to verify alignment "blind". The system of this invention verifies alignment to the required tolerances.

The system of this invention also provides a reliable means to verify elastomeric interface point of contact or engagement. Assuring contact is being made through the elastomeric interface point of engagement is essential to produce manufacturability including testability. The system is also valuable in characterizing different types of elastomeric materials and establishing quantifiable, reliable compression procedures for manufacturing.

The system of this invention utilizes pairs of conductive structures defined in the surface layers of the alumina carrier and the PCB, for example. The first pair of conductive structures relate to the verification of close tolerance mechanical alignment between the alumina carriers and the PCB, and permit alignment verification between mating parts. The design of the conductive structures and the characteristics of the elastomeric interface used determine the tolerance to be defined. The second pair of conductive structures relate to electrical contact between mating assemblies through an elastomeric interface and permit verification of electrical contact between mating parts (elastomeric interface engagement).

An elastomeric interface is one in which conductivity (e.g., electrical) is enabled when the interface becomes engaged. The elastomeric interface can be characterized by properties that will inhibit conductivity when the interface is not engaged (e.g., will not conduct electricity) and permit conductivity when the interface is engaged (e.g., will conduct electricity). The system of this invention utilizes an elastomeric interface that exhibits the above described characteristics to conduct electricity. The elastomeric interface is comprised of a compliant non-conductive material impregnated with conductive material. The conductive materials (e.g., metallic pins) are distributed throughout the non-conductive material in a way that will enable conductivity (e.g., of electricity) when the material is compressed. Compression of the elastomeric interface exposes the pins to provide a direct path from one mating part to the other.

The elastomeric interface, when engaged, allows for the flow of electricity through the elastomeric interface along an axis perpendicular to its surface (e.g., through the pins which are similarly aligned). The function of the elastomeric interface in the system of this invention is to provide a path for electrical conductivity between corresponding pads of mating parts when it is engaged. This type of interface enables testing a complex part without damaging it and without connecting it permanently. The active alignment/contact verification system provides a positive way to insure the mating parts are properly aligned and that the elastomeric inteface is properly engaged.

The detailed description of the active alignment/contact verification system of the present invention will be described hereinafter in two sections or portions, the alignment verification portion being described hereinafter with respect to FIGS. 1A–1B and 2A–2B, while the contact verification portion being described hereinafter with respect to FIGS. 3A–3B and 4A–B.

Figure 1B:
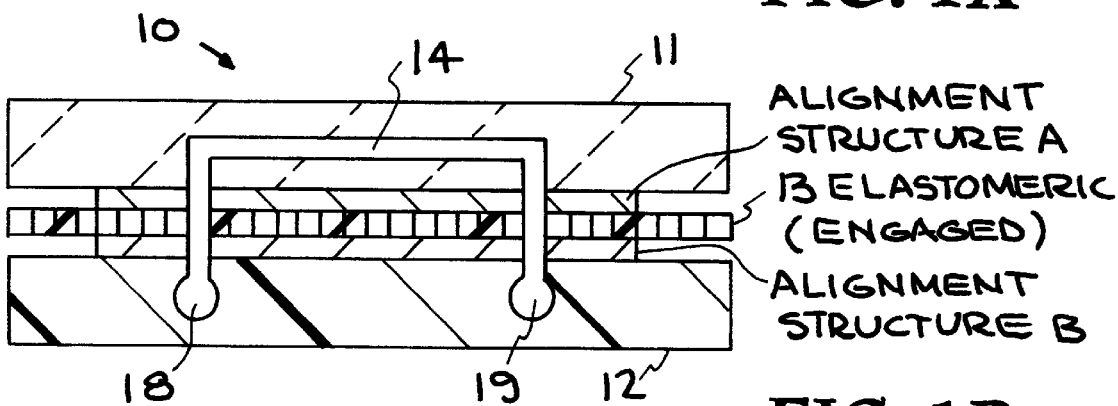
FIG. 1B is similar to FIG. 1A but showing a conductive path with the elastomeric interface engaged.

An embodiment of the active alignment verification portion of the system is illustrated in FIGS. 1A and 1B, wherein the elastomeric is not engaged in FIG. 1A but is engaged in FIG. 1B. The alignment portion of the system as shown in FIGS. 1A and 1B is generally indicated at 10 and includes a pair of parts to be aligned, such as an alumina carrier 11 and a printed circuit board (PCB) 12 having located therebetween an alignment structure A and an alignment structure B, with an elastomeric interface 13 therebetween. The elastomeric interface 13 may, for example, be composed of elastomeric conductive polymer interconnect (ECPI) made by AT&T, Allentown, Pa.; Shin-Flex MAF or GD, made by Shinetso, Union City, Calif.; or Fujipoly W Series Connector, made by Fujipoly Inc., Cranford, N.J., having a thickness of 0.15 mm to 2.2 mm, but preferably constructed of Shin-Flex MAF with a thickness of 0.5 mm. For large applications the elastomeric interface can be thicker. The alignment structures A and B will be discussed hereinafter with respect to FIGS. 2A–2B. Note that in FIG. 1A the elastomeric interface 13 is not engaged as indicated by legend.

FIG. 1B illustrates the same components as FIG. 1A but the elastomeric interface 13 is engaged, as indicated by legend, so as to form an electrical path generally indicated at 14 which goes from a contact pad 18 in the PCB 12 through the elastomeric interface 13, through the alumina carrier 11, through the elastomeric interface 13, and back to a contact pad 19 in the PCB 12, as described in detail hereinafter.

The system utilizes, as set forth above, pairs of conductive structures, with the first pair (FIGS. 2A–2B) relating to close tolerance mechanical alignment between the alumina carrier 11 and the PCB 12, and with the second pair (FIGS. 4A–4B) relating to electrical contact between mating surfaces or sections of the alumina carrier 11 and the PCB 12. This arrangement permits alignment verification between mating parts and permits verification of electrical contact between mating parts.

The system of this invention utilizes four pairs of the second type of conductive structure (i.e., of the type in FIGS. 4A and 4B) located near each corner of the substrate. These structures are used first and determine when the elastomeric interface is engaged. The number and placement of these structures is designed to ensure that the elastomeric interface is uniformly engaged. Once the mating parts are in contact via the engaged elastomeric interface, additional pairs of conductive structures (i.e., of the type in FIGS. 2A and 2B) enable verification that the mating parts are properly aligned in X, Y and Theta. The number, placement and design specifications of these pairs is related to the position tolerancing required by the design of the mating parts. The system of this invention requires two pairs of this type of structure.

Figure 2A:
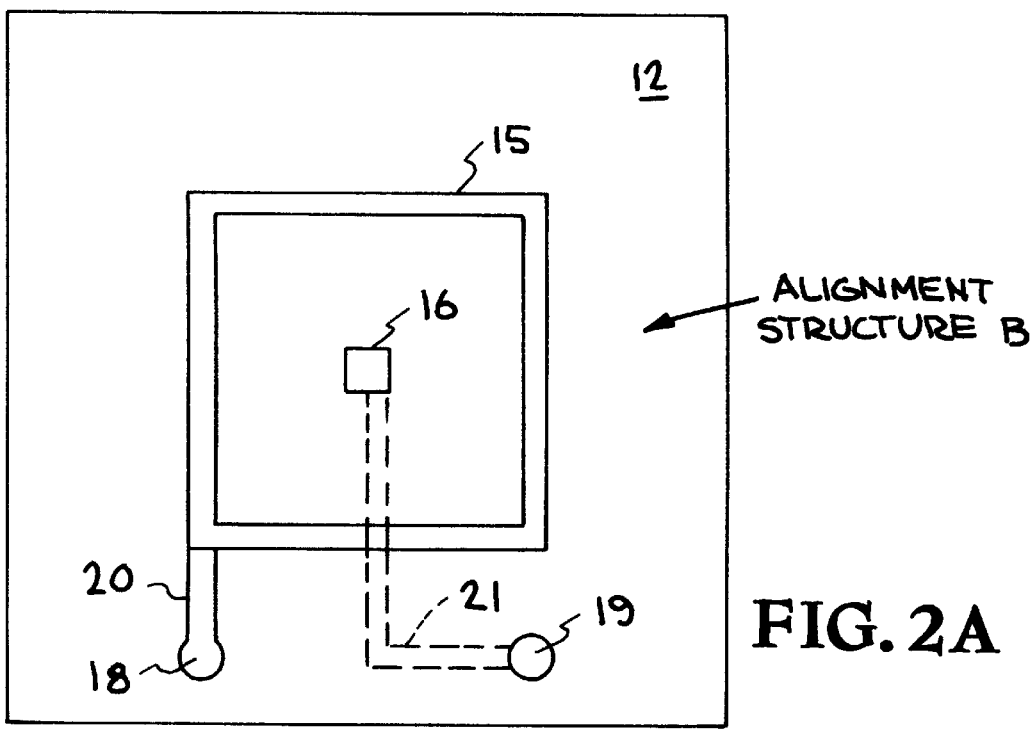
FIGS. 2A and 2B illustrate two pairs of structures which consist of concentric patterns utilized by way of example to illustrate alignment verification.
Figure 2B:
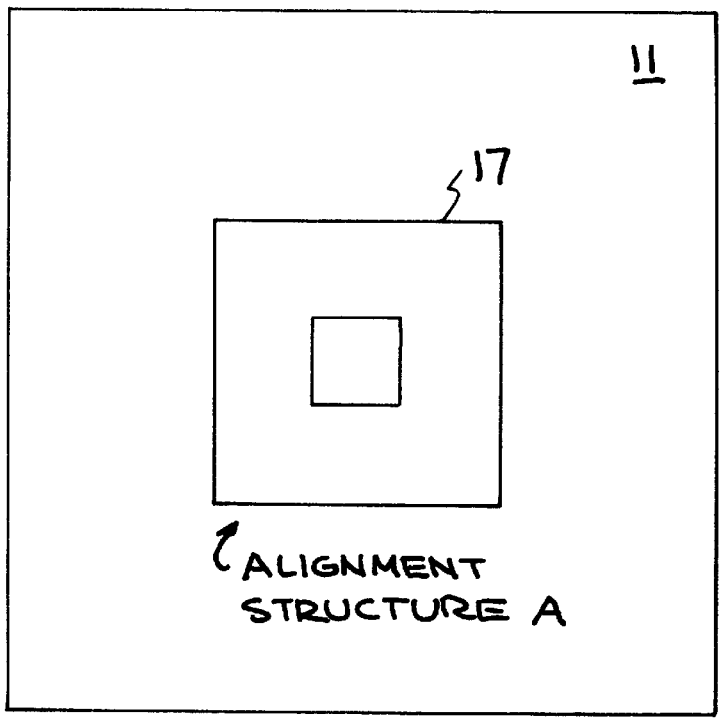

The first pair of conductive structures consist of concentric conductive patterns, as shown in FIGS. 2A and 2B, with components similar to those in FIGS. 1A–1B having corresponding reference numerals. Alignment structure B includes two concentric patterns 15 and 16, with alignment structure A having a pattern 17 concentric with patterns 15 and 16 of alignment structure B. Positioned on the printed circuit board 12 are electrical contact pads 18 and 19, connected via leads 20 and 21 to concentric patterns 15 and 16. Pads 18 and 19 are operatively connected to an Ohm meter or alternately to another circuit on the PCB 12, to measure the conductivity when the concentric patterns are bridged. Pads 18 and 19 (for each of the structures 15 and 16 in FIG. 2A) are brought out to an area outside the outline of the alumina substrate to enable probing with an Ohm meter, etc., or alternatively to other circuitry on the PCB 12 in the event additional detection circuitry is needed. The lead line 21 from structure 16 must be brought over using a layer other than the surface layer of the PCB to prevent contact with the outer structure 15. Conductivity through the pads 18 and 19 (path 14 in FIG. 1B) is created by the bridging of pattern 17 of alignment structure A across the two patterns 15 and 16 of alignment structure B, due to the non-alignment of the concentric patterns. When the concentric patterns 15–17 are aligned there is no bridging and thus no conductivity via pads 18 and 19. While the concentric patterns are illustrated a square, other configurations may be used. Thus, when the alumina carrier 11 and the PCB 12 are assembled (the elastomeric interface 13 is engaged) and aligned to one another within tolerance, there is no flow through electrical path 14 (open circuit), in FIG. 1B. The tolerance is determined by the design of the concentric patterns 15–17 and the distance therebetween so as to prevent bridging and formation of the conductive path 14 at pads 18 and 19. When the alumina carrier 11 and the PCB 12 are not aligned within the tolerance defined by the concentric patterns 15–17, there is flow through the electrical path or conductivity, as indicated at 14 and pads 18 and 19 in FIG. 1B, the elastomeric interface 13 being engaged. The "path" 14, as shown in FIG. 1B, goes for example, from pad 18 on the PCB 12 through the elastomeric interface 13, through the alumina carrier 11, through the elastomeric interface 13, and back to pad 19 on the PCB 12. The conductivity path, as shown in FIGS. 2A–2B, goes, for example, from pad 18 to lead 20, through pattern 15, pattern 17, pattern 16, through lead 21 to pad 19. Thus, conductivity via pads 18 and 19 establishes non-alignment between the alumina carrier 11 and the PCB, and no conductivity via pads 18 and 19 establishes alignment within the tolerance defined by the concentric patterns 15–17.

Figure 3A:
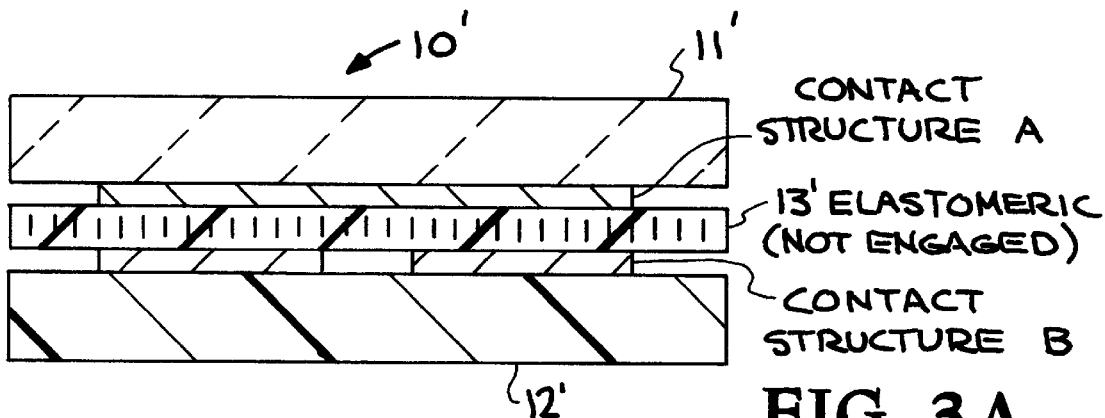
FIG. 3A is a cross-sectional side view of an embodiment of the contract structures of the present invention, with the elastomeric interface not engaged.
Figure 3B:
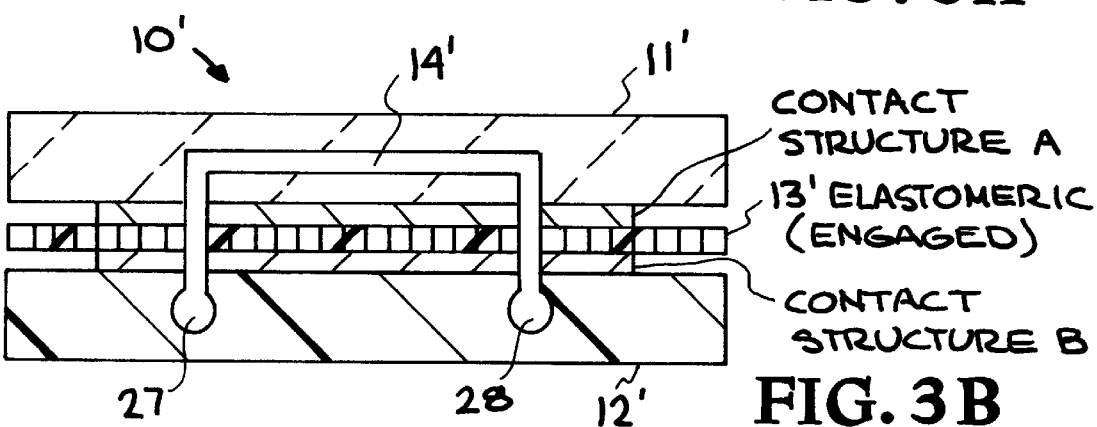
FIG. 3B is similar to FIG. 3A but showing a conductive path with the elastomeric interface engaged.

An embodiment of the active contact verification portion of the system is illustrated in FIGS. 3A and 3B, wherein the elastomeric is not engaged in FIG. 3A but is engaged in FIG. 3B. Since certain of the components of FIGS. 3A–3B are similar to those of FIGS. 1A–1B, corresponding reference numerals will be used. The contact portion of the system as shown in FIGS. 3A and 3B is generally indicated at 10' and includes an alumina carrier 11' and a printed circuit board (PCB) 12' having located therebetween a contact structure A and a pair of contacts comprising contact structure B, with an elastomeric interface 13' therebetween. The elastomeric interface 13' may be constructed as above described with respect to FIGS. 1A–1B. The contact structures A and B will be discussed with respect to FIGS. 4A–4B. Note that in FIG. 3A the elastomeric interface 13' is not engaged as indicated by legend. FIG. 3B illustrates the same components as FIG. 3A but the elastomeric interface 13' is engaged, as indicated by legend, so as to form an electrical path generally indicated at 14' which goes from a contact pad 27 in the PCB 12' through the elastomeric interface 13', through the aluminia carrier 11' through the elastomeric interface 13' and back to a contact pad 28 in the PCB 12, as described in detail hereinafter.

Figure 4A:
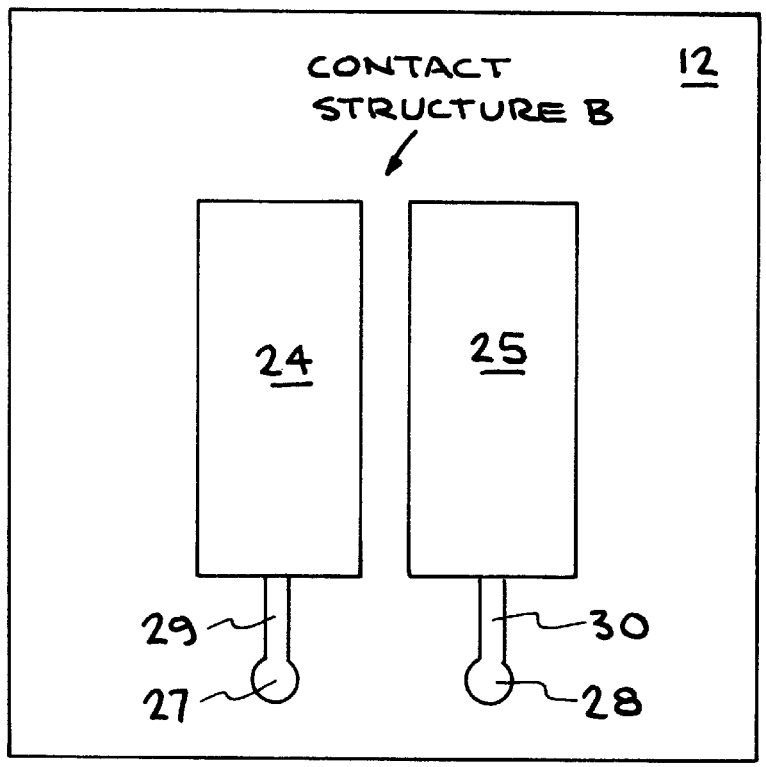
FIGS. 4A and 4B illustrate two pairs of structures which consist of two rectangles and a square utilized by way of example to illustrate contact verification.
Figure 4B:
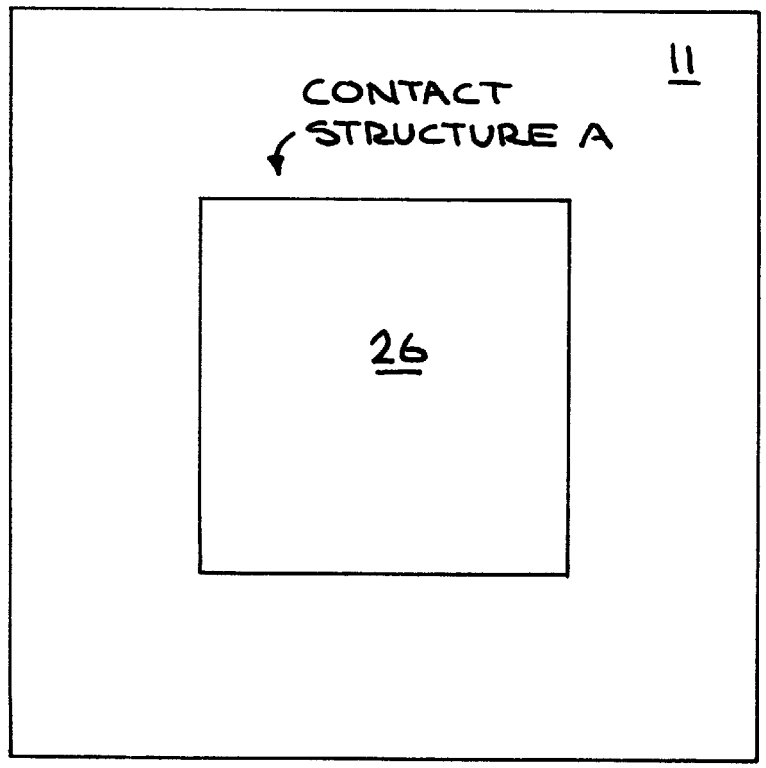

The second pair of conductive structures, as shown in FIGS. 4A and 4B, consist of two conductive patterns of a rectangular configuration, 24 and 25 forming contact structure B and a square conductive pattern 26 on a contact structure A. The contact structures A and B of FIGS. 3A–3B generally correspond to the alignment structures A and B of FIGS. 1A–1B relative to the alumina carrier 11' and the PCB 12'. Other configurations of the conductive patterns of FIGS. 3A–3B and 4A–4B may be utilized. Positioned on the printed circuit board 12' are electrical contact pads 27 and 28, connected via leads 29 and 30 to rectangular conductive patterns 24 and 25, respectively. Pads 27 and 28 may be operatively connected to an Ohm meter or detection circuitry, as described above. The components 24–28 are designed to form an electrical path, such as indicated at 14' from the PCB 12', through the elastomeric interface 13', through the alumina carrier 11', through the elastomeric interface 13', to the PCB 12'. The electric "path", such as path 14' in FIG. 3B, is formed when there is sufficient compression of the elastomeric interface to allow its elements to come into contact with the metallic structures (engagement) as in FIG. 3B. The elastomeric interface 13' requires compression to work (to become engaged). The conductive patterns of contact structures A and B are designed to enable (electronically) verification of the engagement of the elastomeric interface 13'. As seen in FIGS. 4A and 4B, when engagement of the elastomeric interface 13' occurs, there is conductivity between pads 27 and 28 via, for example, from pad 27 to lead 29, conductive pattern 24, conductive pattern 26, conductive pattern 25, and lead 30 to pad 28. The amount of compression required to establish engagement of the elastomeric interface 13' will vary with the application to which it is applied. For example, to verify electrical contact between an alumina carrier and a printed circuit board, the compression force is determined by the physics of the parts, namely, size, shape of the carrier and PCB, method of clamping and characteristics of the elastomeric interface. The contact structures (FIGS. 4A–4B) and associated technique provide a reliable way to characterize various elastomeric interfaces.

It has thus been shown that the present invention provides an active alignment/contact verification system, which is particularly applicable for the assembly/matching of alumina carrier or substrates with printed circuit boards which require very close tolerances. However, this system can be utilized in various applications requiring precision mating of parts where bulkier and or larger mechanical means are impractical or impossible. The system is ideal for applications when mating parts cannot be aligned visually.

As pointed out above, the system can be effectively used by the measurement of capacitance rather than resistance, as described in FIGS. 2A–2B and 4A–4B. In the capacitance approach the conductive path linking structures on a carrier or substrate and a printed circuit board would constitute one plate of a capacitor. The backside metalization of the substrate would constitute the other plate. The alumina substrate is the dielectric, and in the capacitance approach, the conductive path creates the largest "plate" when optimum alignment is achieved.

The present invention thus consists of the use of conductive patterns or features for mating components (e.g. alumina substrate/printed circuit board) that enable electrical alignment verification, elastomeric interface engagement verification, and "blind" alignment of such parts to close tolerances.

While particular embodiments, conductive patterns, configurations, materials, perimeters, etc. have been described or illustrated to exemplify and set forth the principles of the invention, such are not intended to be limiting. Modifications and changes may become apparent to those skilled in the art, and it is intended that the invention be limited only by the scope of the appended claims.

What is claimed is:

1. A system for alignment/contact verification of mating components, comprising a first structure means for verification of alignment of associated mating components;

a second structure means for verification of contact of associated mating components; and an elastomeric interface located between associated mating components;

each of said first and second structure means including electrically conductive patterns, whereby alignment of said electrically conductive patterns of said first structure means establishes a zero electrical flow through the conductive patterns thereof, thereby verifying alignment of associated mating components, and whereby contact of said electrically conductive patterns of said second structure means establishes an electrical flow through the conductive patterns thereof, thereby verifying contact of associated mating components.

2. The system of claim 1, wherein each of said first and second structure means is provided with a plurality of said electrically conductive patterns which are matching.

3. The system of claim 2, wherein each of said first and second structure means is composed of a pair of structures, each structure of each of said pairs of structures being provided with at least one of said electrically conductive patterns.

4. The system of claim 3, wherein each of said pairs of structures include a first structure with a plurality of electrically conductive patterns thereon, and a second structure with at least one electrically conductive pattern thereon.

5. The system of claim 4, wherein one of said pairs of structures has said electrically conductive patterns formed in a non-concentric configuration.

6. The system of claim 5, wherein said first structure has a pair of concentric conductive patterns thereon, and wherein said second structure has one conductive pattern therein which is concentric with said concentric conductive patterns on said first structure.

7. The system of claim 4, wherein one of said pairs of structures has said electrically conductive patterns formed in a non-concentric configuration.

8. The system of claim 7, wherein said first structure has pair of rectangular configured conductive patterns thereon, and wherein said second structure has one square conductive pattern thereon.

9. The system of claim 1, wherein said elastomeric interface is composed of a material having properties that will inhibit conductivity when the interface is not engaged and permit conductivity when the interface is engaged.

10. The system of claim 9, wherein said elastomeric interface has a thickness in the range of 0.15 mm to 2.2 mm.

11. The system of claim 1, wherein said elastomeric interface is located adjacent at least one of said first and second structure means.

12. The system of claim 1, wherein said first and second structure means are adapted to be positioned intermediate associated mating components.

13. An active verification system for at least one of alignment, contact, and alignment and contact of mating parts, comprising:

first and second structure means including conductive patterns for alignment/contact verification of associated mating parts; and an elastomeric interface adapted to be located between such associated mating parts;

whereby alignment verification is determined by a zero electric flow through said electrically conductive patterns, and contact verification is determined by an electric flow through said electrically conductive patterns.

14. The active verification system of claim 13, wherein said structure means is constructed for alignment verification of such associated mating parts.

15. The active verification system of claim 13, wherein said structure means is constructed for contact verification of such associated mating parts.

16. The active verification system of claim 13, wherein said structure means is constructed for both alignment and contact verification of such associated mating parts.

17. The active verification system claim 13, wherein the mating parts comprise an alumina carrier and a PCB.

18. An active system for at least one of verification of alignment of mating parts and verification of contact of mating parts, comprising:

a structure means including electrically conductive patterns for verification of alignment/contact of associated mating parts; and an elastomeric interface adapted to be located between such associated mating parts;

whereby alignment verification is determined by a zero electric flow through said conductive patterns, and contact verification is determined by an electric flow through said conductive patterns.

* * * * *